United States Patent [19]

Kembo et al.

[11] 4,213,117
[45] Jul. 15, 1980

[54] METHOD AND APPARATUS FOR DETECTING POSITIONS OF CHIPS ON A SEMICONDUCTOR WAFER

[75] Inventors: Yukio Kembo, Yokohama; Asahiro Kuni, Tokyo; Hiroshi Makihira, Yokohama, all of Japan

[73] Assignee: Hitachi, Ltd., Japan

[21] Appl. No.: 964,353

[22] Filed: Nov. 28, 1978

[30] Foreign Application Priority Data

| Nov. 28, 1977 | [JP] | Japan | 52-141643 |
| Apr. 3, 1978 | [JP] | Japan | 53-38135 |
| Apr. 12, 1978 | [JP] | Japan | 53-42115 |
| Apr. 14, 1978 | [JP] | Japan | 53-43226 |

[51] Int. Cl.$^2$ ............................................. G06K 9/04
[52] U.S. Cl. .............................. 340/146.3 H; 250/201; 250/561; 364/490
[58] Field of Search ................. 340/146.3 H; 364/490, 364/491, 515; 250/221, 222 R, 561, 201; 356/375

[56] References Cited

U.S. PATENT DOCUMENTS

| 3,575,588 | 4/1971 | Hermann | 364/491 |
| 3,693,154 | 9/1972 | Kubo et al. | 340/146.3 H |
| 3,796,497 | 3/1974 | Mathisen et al. | 364/515 |
| 3,898,617 | 8/1975 | Kashioka et al. | 340/146.3 H |
| 3,955,072 | 5/1976 | Johannsmeier et al. | 364/490 |
| 4,091,394 | 5/1978 | Kashioka et al. | 340/146.3 H |
| 4,115,762 | 9/1978 | Akiyama et al. | 340/146.3 H |

OTHER PUBLICATIONS

Bojman, "Electro-optical Alignment of Substrates", IBM Tech. Disclosure Bulletin, vol. 13, No. 9, Feb., 1971, pp. 2687-2688.
Davis et al., "Automatic Registration in an Electron-beam Lithographic System", Solid State Technology, Aug., 1978, pp. 61-67.

Primary Examiner—Leo H. Boudreau
Attorney, Agent, or Firm—Craig & Antonelli

[57] ABSTRACT

A method and apparatus for detecting positions of chips on a semiconductor wafer. The method comprises an illuminating step for illuminating obliquely the semiconductor wafer from above including at least a position detecting direction; a totalizing step for optically totalizing, when the irregular reflecting rays reflecting at the semiconductor wafer illuminated at the illuminating step are photographed by an image pickup element or device, the irregular reflecting rays in the direction normal to the position detecting direction or for electrically totalizing the levels of a video signal produced by the image pickup element or device in the same direction; a video signal detecting step for producing a video signal with coordinates lying in the position detecting direction by photographing an image resulting from optical totalization at the totalizing step by the image pickup element or device or electrically totalizing the image; and a street position detecting step for detecting a street position between chips by extracting a specific coordinate with a wide width and a low level corresponding to dark from the video signal produced at the video signal detecting step. The apparatus executes the above-mentioned method.

11 Claims, 26 Drawing Figures

METHOD AND APPARATUS FOR DETECTING POSITIONS OF CHIPS ON A SEMICONDUCTOR WAFER

BACKGROUND OF THE INVENTION

1. Field of the Invention

The invention relates to a method and apparatus for detecting positions of chips on a semiconductor wafer.

2. Description of the Prior Art

The position detection of chips on a semiconductor wafer is needed in the following cases, for example: a semiconductor wafer is set in an apparatus for depicting dicing lines on a dicing area called a dicer; a semiconductor wafer is set in an apparatus called a prober for checking electric characteristics of chips; a semiconductor wafer is set in an apparatus called a bonder for connecting bonding pads to exterior circuits; a semiconductor wafer is et in an apparatus called a printer for printing a circuit pattern on a semiconductor wafer.

An example of the semiconductor wafer in question is illustrated in FIG. 1. As shown, a number of chips formed on a semiconductor wafer 1 are segmented by a dicing area (street). In the manufacturing process of the semiconductor, cutting lines, or dicing lines are depicted on the dicing area, and then the semiconductor wafer are cut in a gridiron pattern to be separated into individual chips. Then, on the marginal area of each chip are connecting terminals called bonding pads 5 for connecting to exterior and complex circuit patterns 6.

One of prior arts, which relates to a method for detecting the positions of chips on a semiconductor wafer and is believed to be closest to the present invention, is U.S. Pat. No. 3,898,617, which is also assigned to the assignee of this invention, on a chip position detecting method by pattern matching. This chip position detecting method will be briefed with reference to FIGS. 3 and 4. As shown in FIG. 3, a field of detection 7 on the semiconductor wafer 1 is inputted into a TV camera 10, through an objective lens 8 and a relay lens 9. A video signal from the TV camera 10 is processed in a position detecting circuit 11 where the chip position is detected and calculated. A lamp 15 illuminates the detection field via a semitransparent mirror 16.

The chip position detection circuit 11 will be elaborated with reference to FIG. 4. The TV camera is raster-scanned by an output of a synchronous signal generating circuit 12 to drive the camera 10 thereby to extract a video signal of the detection field 7. The position (X and Y coordinates) of scanning beam at that time is successively obtained by a coordinate generating circuit 13 on the basis of the synchronous signal delivered from the synchronous signal generating circuit 12. The video signal from the TV camera 10 are digitized in accordance with the brightness. More specifically, it is converted into a binary form by a binary digitizing circuit 17 and then is applied to a temporary memory circuit 18 comprising a shift register, for example. Two-dimensional pattern data is read out in parallel from the temporary memory circuit 18 which is a dynamic memory, by means of a two-dimensional pattern quarry circuit 20. Two-dimensional patterns in the field 7 of the TV camera 10 are successively inputted into the two-dimensional pattern quarry circuit as the scanning progresses. The data are successively compared with a dictionary pattern 23a of a configuration of a reference chip previously stored in a dictionary pattern memory circuit 19, by means of a matching circuit 21. Through this comparison, a matching quantity between them is detected. As the patterns quarried by the two-dimensional pattern quarry circuit 20 are scanned, the matching quantity extracted from the matching circuit 21 is subsequently compared with the reference one in the chip position detection circuit 22. Through the comparison, when the matching quantity maximizes, the coordinate outputted at this time from the coordinate generating circuit 13 is stored. The coordinate stored is the chip position. That is to say, the chip position is thus detected.

In a usual semiconductor manufacturing process, several hundreds kinds of semiconductor wafers must be handled having several hundreds kinds of chips with various sizes 0.4 mm×0.4 mm to 6 mm×6 mm and various reflectivities owing to the use of different materials in the circuit pattern area. Therefore, the pattern matching method needs several hundreds kinds of dictionary patterns $23_2$ to $23_p$ (p is 100–1000) in accordance with several hundreds kinds of chips used. For this reason, a substantially large memory capacity is necessary for the memory 24 and therefore the switching operation thereof is extremely complicated.

In order to identify the circuit pattern or the dicing area (street) for each chip by using the pattern matching method 1 mm×1 mm or more of size is required for the dictionary pattern. The size of the field taken by the TV camera 10 must be three times the dictionary pattern e.g. 3 mm×3 mm, in order to search the best matched point while shifting the pattern caught by the TV camera 10 in X- and Y-directions for each picture element. In this case, however, the resolution is poor and therefore the possible accuracy of detection is at most ±10 μm. This is a serious problem to be solved immediately.

As described above, the conventional pattern matching method is disadvantageous in that the memory, the calculation circuit and like are very complicated and costly with poor detection accuracy. Therefore, the pattern matching method is problematic in practical use.

SUMMARY OF THE INVENTION

Accordingly, an object of the invention is to provide a method and apparatus for detecting the positions of chips on a semiconductor wafer in which the positions of chips on various kinds of semiconductor wafers may be detected easily and with high accuracy.

In the present invention, in the light of the fact that the semiconductor wafer is segmented into a great number of chips by the dicing area (street), the longitudinal direction of the streets formed on the semiconductor wafer is disposed substantially normal to the chip position detecting direction. The surface of the semiconductor wafer is symmetrically illuminated obliquely from above with parallel rays of light. Irregular reflecting rays from the surface of the semiconductor wafer are optically totalized in a direction orthogonal to the chip position detecting direction and applied to an image pickup device or a camera, with the result that a video signal extending in series in the chip position detecting direction, is obtained. Alternately, the levels of the video signal produced by the image pickup device or the camera photographing the irregular reflecting rays from the semiconductor wafer surface are electrically totalized in a direction orthogonal to the chip position detecting direction, with the result that a video signal extending in series in the chip position detecting direction is obtained. The specific parts of the video signal are extracted to obtain the positions of streets.

The specific parts of the video signal have not always the lowest levels. For this, it can not obtain the position of the street directly from the video signal. However, the specific parts take low levels with relatively wide widths, and therefore the position of the street may roughly be obtained by smoothing the video signal. When the parallel rays of illuminating the wafer obliquely from above is directed substantially orthogonal to the position detecting direction, the specific parts of the video signal appears taking the minimum levels, enabling the position of the street to be roughly obtained.

DESCRIPTION OF THE PREFERRED EMBODIMENTS

Figure 1:
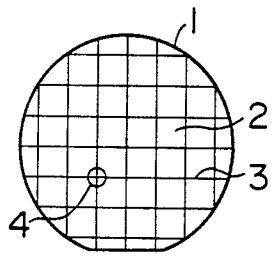
FIG. 1 shows a plan view of a part of a semiconductor wafer of which the chip positions are detected.
Figure 2:
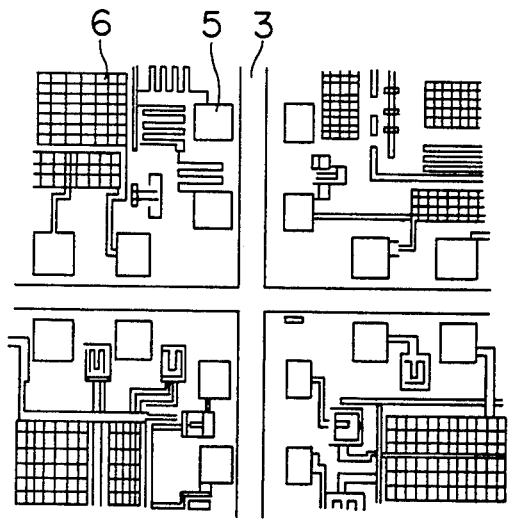
FIG. 2 shows an enlargement of a part of the wafer shown in FIG. 1.
Figure 3:
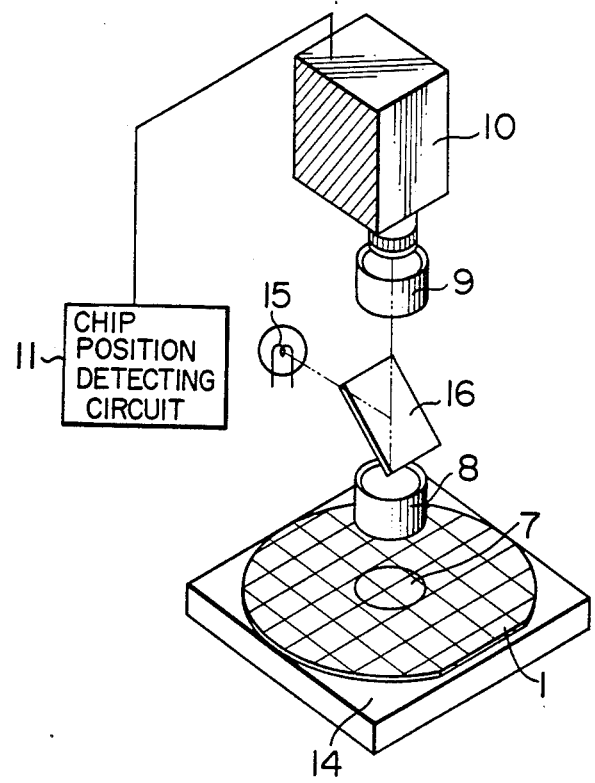
FIG. 3 shows a schematic diagram of a conventional chip position detecting apparatus.
Figure 4:
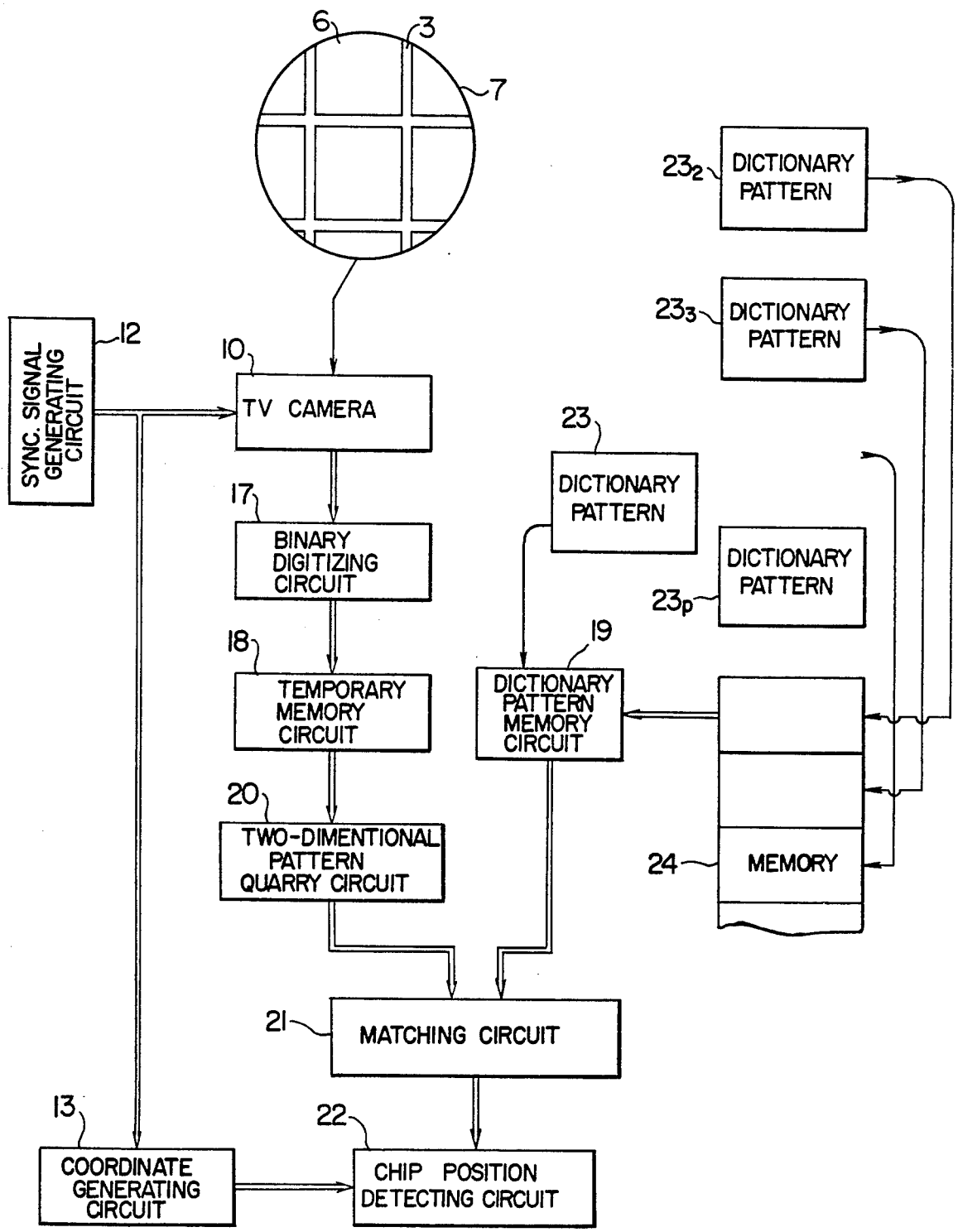
FIG. 4 shows a block diagram of a conventional signal processing circuit.

An embodiment of an apparatus for detecting positions of chips on a semiconductor wafer will be described with reference to FIGS. 5 through 12.

In the position detecting apparatus, a street 3 between adjacent chips 2 on a semiconductor wafer 1 is detected by a couple of detecting systems 100 and 101. On the basis of the result of the street detection, the Y- and θ-directions of the wafer are positioned at a reference position 81 of an optical system. Then, the wafer 1 thus aligned with respect to the Y-direction and the θ-direction is rotated by 90°. A similar alignment operation is applied to the X-direction of the wafer.

More specifically, a detection field 82 on the wafer 1 is magnificantly imaged on a slit plate 84 with a slit 83 elongating in the X-direction, through an objective lens 8. A bundle of rays 85 passed through the slit 83 opening in the X-direction is converted by a photodiode or a photomultiplier 86 into an electrical signal which in turn is applied to a position detecting circuit 102. The detection is made by driving a Y-table 14 by a Y-drive system 104 including a pulse motor. An amount of a displacement of the Y-table 14 is detected by a linear positioning scale (so-called a linear encoder) 87 which produces one pulse for a linear displacement of 1 μm by an optical grating, and then is inputted into the position detection circuit 102. In the position detecting circuit 102, in correspondence between a displacement amount 88 from the linear encoder 87 and a signal 89 from the photodiode or a photomultiplier 86 and, a video signal 90 is produced corresponding to a pattern on the detection field. The video signal 90 is properly processed to accurately detect the Y-directional position of the street. In this manner, the accurate position of the street 3 is detected by the detector pairs 100 and 102. Then, the accurate detected values Y1 and Y2 for the reference position 81 are obtained. By using the values Y1 and Y2, the following equations (1) and (2) are calculated $$Y = (Y1 + Y2)/2 \quad (1)$$

$$\theta = (Y1 - Y2)/l \quad (2)$$

where l is the distance between the detecting systems 100 and 101. The Y-table 14 is driven through a motor control circuit 103 and a Y-drive system 104 in accordance with the equation (1). A θ-table 92 is driven through the θ-drive system 91 including a pulse motor and a motor control circuit 103, in accordance with the equation (2). The drivings of these tables cooperate to position the semiconductor wafer 1 in place.

Figure 6:
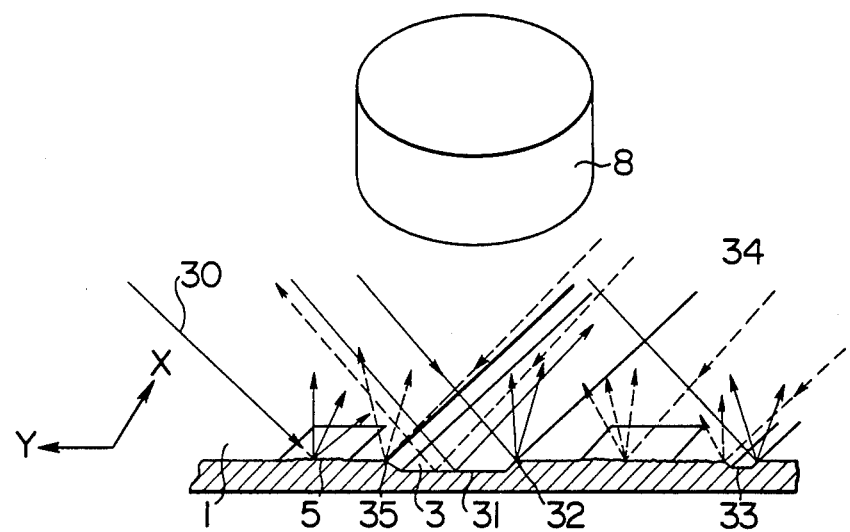
FIG. 6 shows incident rays obliquely incident on the semiconductor wafer having a pattern thereon and reflected rays reflected at the patterned wafer surface.
Figure 8:
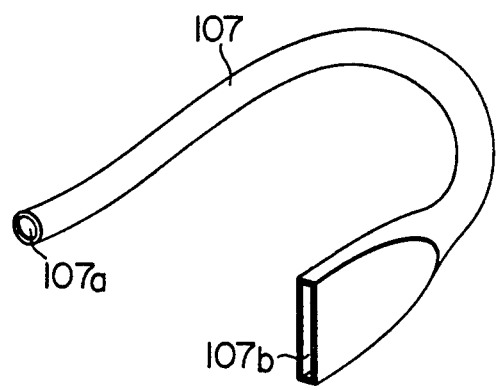
FIG. 8 shows a glass fiber used as illumination means in FIG. 5.

An illumination means is comprised of a light source 106, a condensing lens 105 for condensing light from the light source 106 and a glass fiber 107 for guiding condensed light rays into the semiconductor wafer. With such an arrangement, the illumination means illuminates the semiconductor wafer with a requtangularly configured bundle of parallel rays of a uniform luminous intensity, obliquely from above. The glass fiber 109 is disposed with the square face normal to and symmetrical with respect to the Y-axis. Such illumination means obliquely dark-field illuminates the wafer so that oblique incident light rays in part are irregularly reflected on the pattern on the wafer, as shown in FIG. 6. Specifically, oblique incident rays 30 from right above are regularly reflected at planar part on the wafer 1 and does not enter the objective lens 8, but are irregularly reflected at bonding pads 5, the right edge 32 of the dicing area, and a steped portion 35 of a circuit pattern 33 and enters the objective lens 8. Oblique incident rays 34 from left above also are irregularly reflected at the left edge 35 of the dicing area, the bonding pads 5, the steped portion 35 of the circuit pattern 33 and enters the objective lens 8. As shown in FIG. 8 the optical fiber 107 is provided with a circular right inlet 107a of 5 mmφ and a rectangular outlet 107b of 1.2 mm×1.2 mm. The configuration of the outlet 107 is not necessarily a perfect rectangular but a tetragon similar to the rectangular or an ellipsoid may also be permitted for its configuration. Even if the outlet is so shaped, the light rays emitted therefrom has a uniform illumination intensity in a longitudinal direction. The objective lens 8 has 2.5 of the magnification. NA=0.05 and $W_D$=54.4 mm. The real field is 8 mmφ. Since the long span of the outlet 107b is so selected to be 1.5 times the real field width, the illumination intensity little varies with repect to the X-axis (the position detecting direction) so that the signal to noise ratio of the video signal is remarkably improved and the position may be detected highly accurately. Also, applicable for this is a light-fall dark field illumination by using a combination of a ring mirror and a ring lens, which is used generally in a microscope.

Figure 9A:
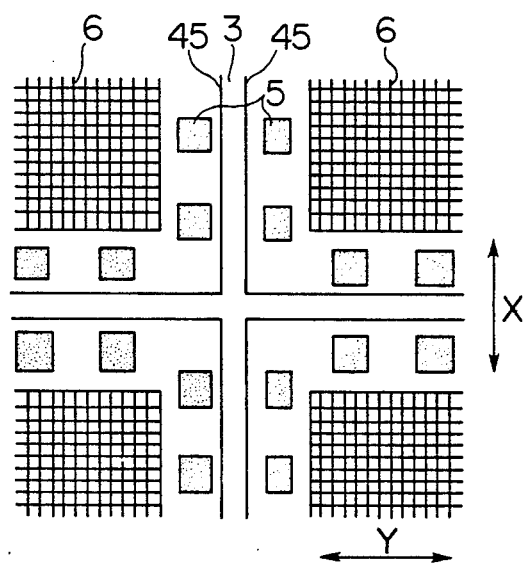
FIG. 9A shows a field image by a dark field illumination (black portions correspond to bright part while portions to dark parts).
Figure 9B:
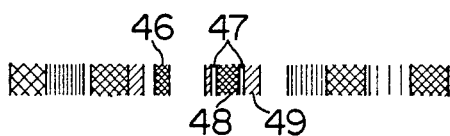
FIG. 9B illustrates an image formed by optically totalizing irregular rays reflected at the field on the semiconductor wafer in a direction (X-axis direction) orthogonal to the chip position detecting direction.
Figure 9C:
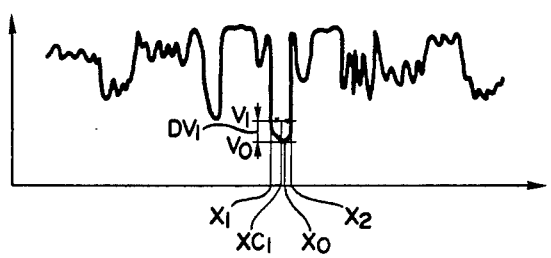
FIG. 9C illustrates a waveform of a video signal produced by a photodiode or photomultiplier when the semiconductor wafer is moved in Y-axis direction.

The detection of the position of a street will be given. FIG. 9A is an enlarged illustration of the detection field 82 shown in FIG. 5. In the pattern on the wafer 1, the surfaces of the wiring pattern including the bonding pads 5, circuit patterns 6 and the edges 38 of the dicing area are detected glinting while the remaining portions are not detected because of being dark. This image is received by a photodiode or photomultiplier 86 with a light receiving face sized enough to cover the slit 83, through the slit 83 elongating in the X-direction. This is equivalent to the totalizing of the quantity of light in the X-direction. Under this condition, the Y drive mechanism 104 is driven to move the Y-table 14 in the Y-direction at a constant speed. The image received at this time by the diode or photomultiplier 86 is an image optically totalized in the X-direction, as shown in FIG. 9B. As shown, a number of bonding pads 5 arranged in a longitudinal direction and the edges 45 of the dicing area 3 (street) continuously extending in the longitudinal direction are each summed to form bright images 47. The circuit patterns are compressed and averaged to be relatively bright. The dicing area 3 and its vicinity form dark images 48 and 49, respectively. Accordingly, a video signal as shown in FIG. 9C may be obtained from the photodiode or photomultiplier 86 which has photographed a one-dimensional pattern formed as shown in FIG. 9B. In FIG. 9C, the x-axis represents a location of an image detected by the linear encoder 87 and the y-axis a level of brightness.

In the video signal, if the part of its waveform corresponding to the street (dicing area) 3 is lowest in the brightness, the signal processing to detect the street position is simple. More specifically, the lowest level $V_o$ is detected and the position $X_o$ of the $V_o$ is considered as a rough position of the street. Then, a signal is cut at the level $V_1$ which is the sum of the Vo and a proper value $DV_1$. As a result, obtained are two points $X_1$ and $X_2$ corresponding to the edges of the street. And a point $XC_1$ at the middle point between the points $X_1$ and $X_2$ is the center position of the street. In an actual signal, however, the signal part corresponding to the street does not necessarily exhibit the lowest level.

Figure 10A:
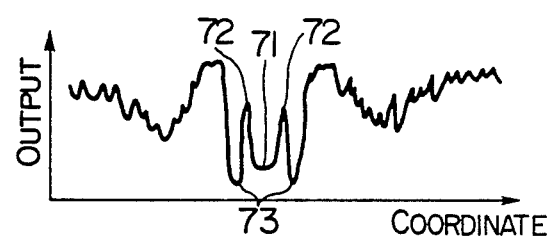
FIGS. 10A to 10C illustrate waveforms of video signals actually produced by a photodiode or a photomultiplier when various kinds of chips on the semiconductor wafer are illuminated.
Figure 10B:
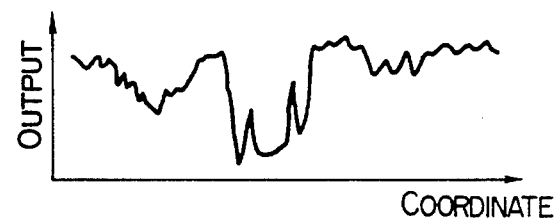
Figure 10C:
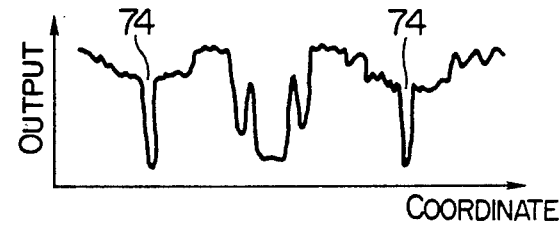

As the video signals shwon in FIG. 10, the shape thereof depends on the kind of the semiconductor wafer. The waveform shown in FIG. 10A has the lowest levels at both sides 73 of the street 3. In the waveform shown in FIG. 10B, the street 3 is asymmetrically waveformed. In FIG. 10C, the lowest levels appear at the positions 74 corresponding to the circuit patterns. Therefore, some means are needed to simply identify the specific part corresponding to the street 3 as a rough position of the street 3 from such video signals.

Figure 11:
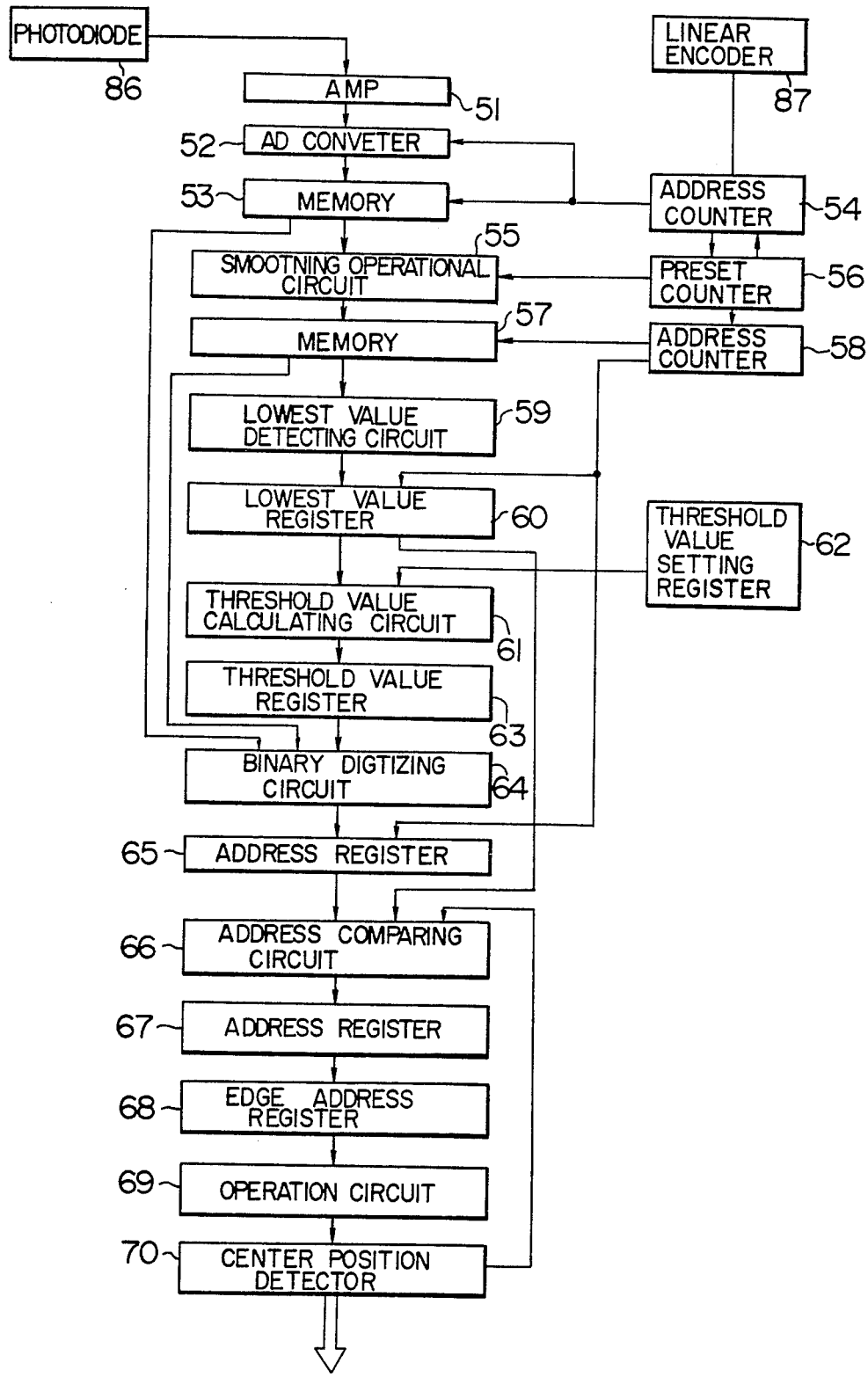
FIG. 11 shows a block diagram of a position detecting circuit shown in FIG. 5.
Figure 12A:
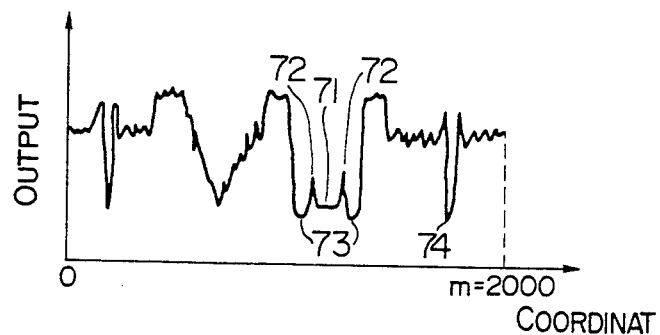
FIG. 12A shows a waveform of a video signal stored in a memory before it is smoothed.
Figure 12B:
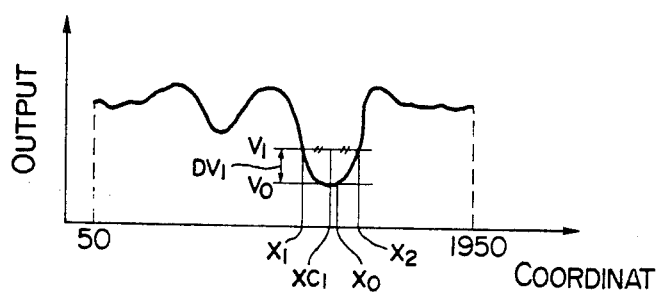
FIG. 12B shows a waveform of a video signal smoothed and stored in a memory and a method for roughly obtaining the center position $SC_1$ of a street by using the video signal.
Figure 12C:
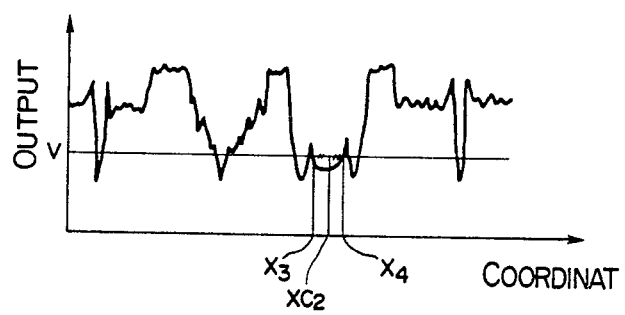
FIG. 12C illustrates a method to obtain the precise center position $XC_2$ of the street by using the video signal shown in FIG. 12A and the rough center position $XC_1$.

A circuit shown in FIG. 11 is an example of the position detecting circuit 102 with such means. The video signal outputted from the photodiode or photomultiplier 86 (referred to as a photodiode) is amplified by an amplifier 51 and then passes through an A-D converter 52 to be digital signals of multigradation. At the same time, an address counter 54 counts pulses generated from the linear encoder 87 one for each displacement of 1 μm to obtain the coordinate value and specifies an address corresponding to the coordinate value. A memory 53 stores a digital signal at the address corresponding to the coordinate value specified as shown in FIG. 12A. The content of the memory 53 is subsequently read out by the address counter 54 and the read-out one is transferred to a smoothing operational circuit 55. The smoothing operational circuit 55 accumulatively sums incoming data of 2n in succession. 2n of data to be transferred to the smoothing circuit 55 are set by a preset counter 56 and when data from the first address to the 2nth address have been transferred, the data transfer ceases and the address counter 54 is set so as to start its operation from the second address and waits for the succeeding operation. The value having been accumulated up to this time in the smoothing operational circuit 55 is divided by 2n to be smoothed and the divided one is inputted into a memory 57. Data address, which at this time is loaded into the memory 57 together with the smoothing data, is specified as the nth address by the address counter 58. The address counter 54 transfers the data in the addresses from the second address to the (2n+1) in the memory 53 to the smoothing operational circuit 55. The smoothed data is transferred as the data in the (n+1)th address by the address counter 58 to the memory 57. In this manner, the detected signal is subsequently smoothed (averaged) (m−2n) times (where m is number (coordinate number) of the data stored in the memory 53) and stored in the memory 57 are the smoothed data from the nth to the (m-n)th, as shown in FIG. 12B. In other words, to determine one coordinate point, used is a value that ± n outputs with respect to the point are simply averaged. That is, partial and minute variations are neglected and an overall variation alone is extracted effectively. This will be seen when comparing the contents stored in the memory 53 as shown in FIG. 12A with the contents stored in the memory 57 as shown in FIG. 12B. In FIGS. 12A and 12B, m=2000 and n=50. The ordinate represents an output value and the abscissa represents addresses. On the abscissa scale, one address corresponds to 1 μm since one pulse is produced every time the linear encoder 87 moves 1 μm. m=2000 implies that a range of 2 mm is observed. Although the contents of the preset counter 56 is selected 2n=100, it is preferable to be set to be variable so as to satisfy the end of the smoothing.

Through this smoothing or averaging, the signal variations 72 corresponding to the edges of the street is eliminated and the partially negative going part 74 corresponding to the dark portion of the circuit pattern also rises into the high level part. The lowest part appears only at the signal 71 corresponding to the street area. That is to say, the street area is widely depressed in the waveform and therefore if the video signal including such a portion is smoothed, the street area exhibits the lowest level. Thus, the content of the memory 57 is read out by the address counter 58 and the lowest value Vo and the address thereof Xo are detected by a lowest value detecting circuit 59 and then are loaded into a lowest value register 60. Then, a threshold value calculating circuit 61 produces a value $Vo+DV_1=V_1$ by using $DV_1$ stored in a threshold value setting register 62 previously set and loads it into a threshold value register 63. This value and the respective values after smoothed in the memory 57 are inputted into a binary digitizing circuit 64 where these values are compared. Then, an address changing "0" to "1" or "1" to "0" is loaded into an address register 65. This is once compared with Xo in an address comparing circuit 66 and if it is smaller than Xo, the address value is stored temporarily in an address register 67. Following this, an address changing "0" to "1" or "1" to "0" is loaded into the address register 65 and is compared with Xo in the address comparing circuit 66. If the address value is smaller than Xo, the contents of the address register 67 is cleared and the new address value is stored. After this, an address changing from "0" to "1" is inputted into the address register 65 and is compared with Xo in the address comparing circuit 66. If the address value is larger than Xo, the value thus far stored in the address register 67 and the value in the address register 65 are loaded as $X_1$ and $X_2$ to an edge address register 68. In an operation circuit 69, $SC_1=(X_2-X_1)/2$ is calculated and is loaded into as a detected rough center position of the street 3 into a center position register 70. Then, the rough detected position is applied to the address comparing circuit 66 and the contents of the memory 53 is applied to the binary digitizing circuit 65 under control of the address counter 54. After this, the process succeeding to the binary digitization is performed by using exactly the same process and circuit as those in the case of the rough center detection. Through the process, $X_3$ and $X_4$ are detected and, by using a relation $XC_2=(X_4-X_3)/2$, the center position $XC_2$ of the street may be accurately detected. Since the position Xo is not so distant from that of $XC_1$, immediately after Xo is calculated $XC_2$ may be calculated. Further, in case wehre the accuracy is not important, Xo or $XC_1$ may be used as the center of the street 3. The smoothing of the signal as in the above embodiment may be also effected by using a low-pass filter for eliminating the high frequency components included in the video signal.

Another embodiment of the apparatus for detecting positons of chips on the semiconductor wafer will be described with reference to FIGS. 13 to 16. As in the previous embodiment, a couple of detecting systems 110 and 111 detect the street 3 between chips 2 on the semiconductor wafer 1. By using the result of the street detection, the Y-direction and the θ-direction of the wafer 1 are positioned at a reference position 81 of an optical system. Then, the wafer 1 thus aligned with respect to the Y-direction and the θ-direction is rotated by 90°. A similar alignment operation is then applied to the Y-direction of the wafer.

Figure 7:
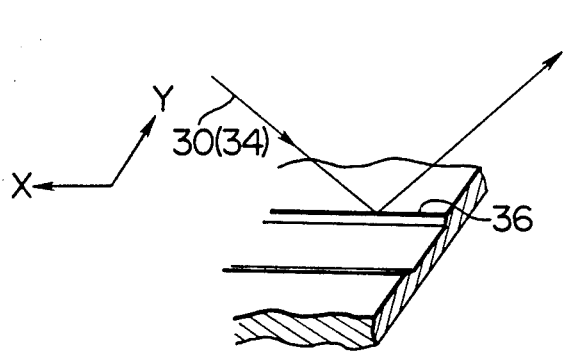
FIG. 7 illustrates how a reflected ray reflects at a pattern on the wafer when an incident ray is incident on the pattern aligned in parallel with the incident ray.
Figure 13:
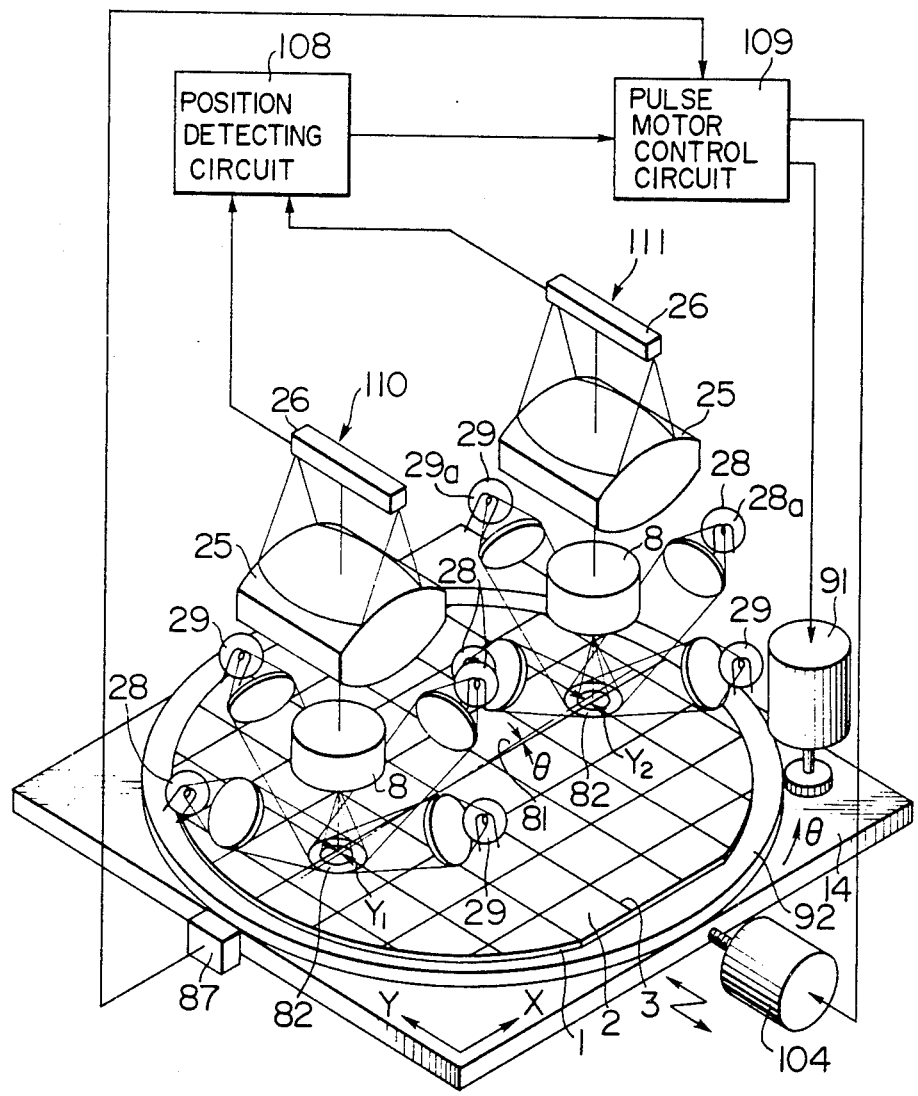
FIG. 13 shows a schematic diagram of another embodiment of the chip position detecting method according to the invention.

As shown in FIG. 13, the detection area 7 on the semiconductor wafer 1 is imaged, with the luminous flux compressed in the X-direction, on a line scanner 26 arranged in the Y-direction, through an optical system comprising an objective lens 8 and a cylindrical lens 25. The line scanner converts the image formed into a corresponding video signal which in turn is applied to a position detecting circuit 108 where the position of the chip is calculated. The detected value drives a pulse motor control circuit 109, a Y-direction pulse motor drive system 104 and a θ-direction pulse motor drive system 91 to cause a table 14 to move, thereby to effect the positioning of the chip 2 on the wafer 1. Each detecting system is provided with a pair of illumination means; a rough detecting oblique illumination 28 disposed above the wafer and orthogonal to the arrangement direction (Y-axial direction) of the line scanner and an accurate detecting oblique illumination 29 disposed in alignment with the line scanner. A rough position of the street is first detected by using the rough detecting illumination 28, the line scanner 26 producing a video signal and a position detecting circuit 108. Then, the accurate detecting illumination 29 is activated and an accurate position of the street is detected on the basis of a video signal delivered from the line scanner 26. The reflecting state shown in FIG. 6 is applied to that when the wafer pattern is illuminated with parallel rays emitted obliquely from above and symmetrically with respect to the Y-direction, as by the accurate detecting illumination 29. The reflecting condition of rays reflecting at the wafer pattern, when the wafer pattern is obliquely illuminated in the X-direction as by the rough detecting illumination 28, is such as shown in FIG. 7. Little irregular reflection is made at the step 36 disposed in parallel with the illumination direction and little irregular reflecting rays enters the objective lens 8. Accordingly, through the oblique illumination in the X-direction, patterns other than planar portions and stepped portions on the wafer 1, wiring patterns and bonding pads are brightly imaged.

Figure 14A:
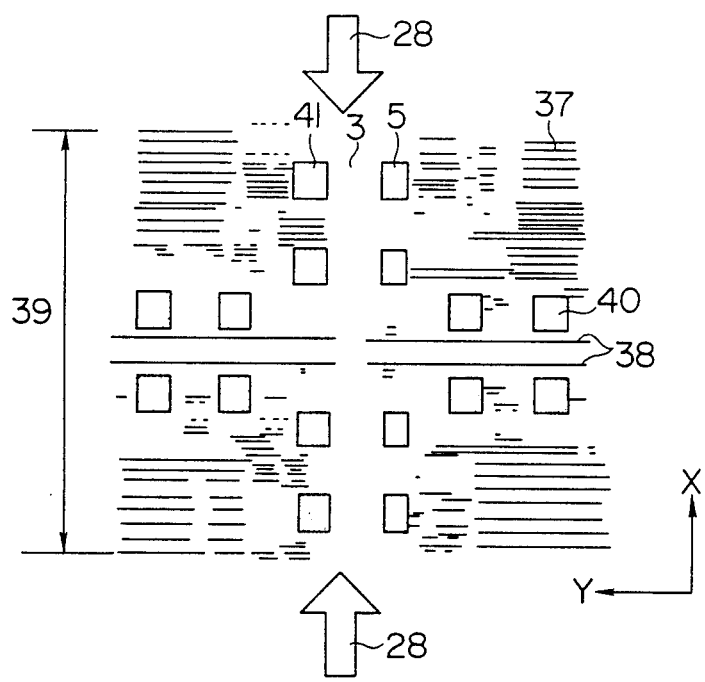
FIG. 14A shows a field image by a rough detecting illumination (black portions correspond to bright portions while white portions to dark portions).
Figure 14B:
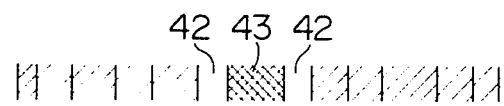
FIG. 14B shows an image formed by compressively collecting reflected light rays from the field image shown in FIG. 14A in the X-direction by means of a cylindrical lens.
Figure 14C:
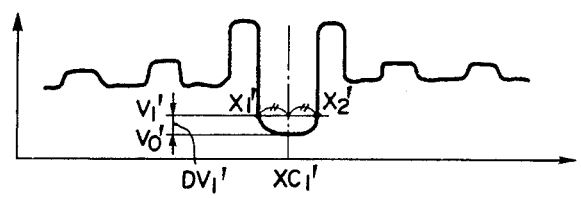
FIG. 14C shows a waveform of a video signal formed by photographing the image shown in FIG. 14B by means of one-dimensional image pickup element and a method for obtaining a rough center position $XC_1'$ of a street.

An explanation will be given how the position of the chip 2 detected by using the rough and accurate illuminations 28 and 29 with reference to FIGS. 14 and 15. Practically, two directions, i.e. X- and Y-directions, must be detected for specifying the chip 2 position. However, only the Y-direction will be described in the position detection, for simplicity. This case is sufficed with detection of only the column street of those streets 3. FIG. 14A shows a part of the detection area 82 in FIG. 13. Through the illumination by the rough detecting illumination 28, the bonding pads 5, lateral circuit patterns orthogonal to the illuminating rays, and the edges 38 of the street are detected glinting while the remaining portions are not detected since these portions are dark. The image is longitudinally compressed by the cylindrical lens 25 and is imaged on the line scanner 26, as shown in FIG. 14B. Accordingly, the lateral pads 40 and the edges 38 of the street are compressed and averaged, together with the lateral circuit patterns 37 so that those are weakly bright, but are not detected as an image. The bonding pads 41 longitudinally disposed are imaged as a bright image. There is no irregular reflecting rays at the space between the bonding pad lines 41 so that the space is imaged as a darkest image 43. Therefore, the line scanner 26 on which one-dimensional pattern shown in FIG. 14B produces a video signal as shown in FUG. 14C. In FIG. 14C, the abscissa represents the positions of images and the ordinate represents the level of brightness. On the ordinate scale, as it goes upwardly in the drawing, the brightness becomes higher. It is evident that the video signal includes only the positional information in the longitudinal direction. In the video signal, the lowest level $V_0'$ represents the space between the longitudinal bonding pad lines 41, the space including the street 3. When the signal is cut at the level $V_1$ which is the sum of $V_0'$ and a proper value $DV_1$, points $X_1'$ and $X_2'$ are detected which correspond to the sides of the longitudinal bonding pads 41. The middle point $XC'$ between the points $X_1'$ and $X_2'$ is a rough position of the street. In other words, in the signal processing by the rough detecting illumination, the rough center $XC_1'$ can be obtained by simply detecting the lowest level $V_0'$ and its associated simple processing, not by using a complicated pattern recognition. In this step of position detection, it is impossible to accurately detect the street position. This accurate position detection is made by using the following accurate detecting illumination 29.

Figure 15A:
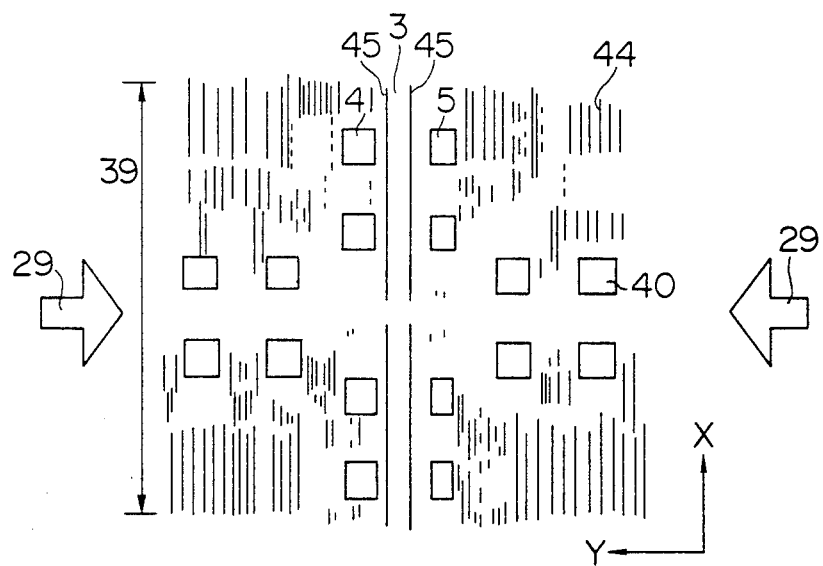
FIG. 15A shows a field image (black portions correspond to bright portions while white portions to dark portions) by a precise detection illumination.
Figure 15B:
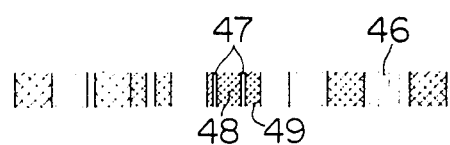
FIG. 15B shows an image formed by compressively collecting (i.e. optically totalizing) relfected light rays from the field image shown in FIG. 15A in the X-direction by means of a cylindrical lens.
Figure 15C:
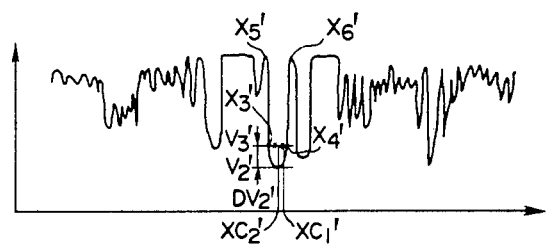
FIG. 15C shows a waveform of a video signal formed by photographing the image shown in FIG. 15B by means of one-dimensional image pickup element and a method for obtaining a precise center position $XC_2'$.

Turning now to FIG. 15A, there is shown a wafer pattern in the detection area when the accurate detecting illumination 29 is used. As shown, only the longitudinal circuit patterns 44 normal to the illuminating rays, the edges 45 of the street normal to the same and the bonding pads 5 are detected while the remaining portions are not detected. The images are compressed and condensed in a longitudinal direction 39 in the drawing by the cylindrical lens 25 and is imaged on the line scanner 26 as shown in FIG. 15B. In the figure, the lateral bonding pads lines 40 and the longitudinal circuit patterns 44 are compressively averaged but, unlike the case of the rough detection, longitudinal image components remain in the one-dimensional image condensed. The longitudinal bonding pads lines 41 and the edges 45 of the longitudinal street are condensed bright, while the longitudinal street forms a darkest image 48. Unlike the rough detection, another dark image 49 is included. This one-dimensional image is shown in FIG. 15C. In the figure, the ordinate represents brightness of the image and the upper of the ordinate is brighter than the lower. The abscissa is representative of the image position. This signal waveform is complicated and it is difficult to detect the position of the street from this signal waveform. However, when the signal processing is carried out relating to only the peaks $X_5'$ and $X_6'$ with the rough center $XC_2'$ therebetween, the street position may be easily obtained in the following procedure.

When the video signals $X_5'$ and $X_6'$ are cut at the level $V_3'$ which is the sum of the minimum level $V_2'$ between the peaks $X_5'$ and $X_6'$ and a proper level $DV_2'$, the signal positions $X_3'$ and $X_4'$ corresponding to the edge 45 of the street can be obtained. The center between the $X_3'$ and $X_4'$ is the center $XC_2'$ of the street. In this manner, the center of the longitudinal street, i.e. the lateral position of the chip, is precisely detected.

The accuracy of the position detection in this method is not deteriorated even when the bonding pads 5 arranged asymmetrically with respect to the street 3 and when various kinds of the objects to be detected are used.

Figure 16:
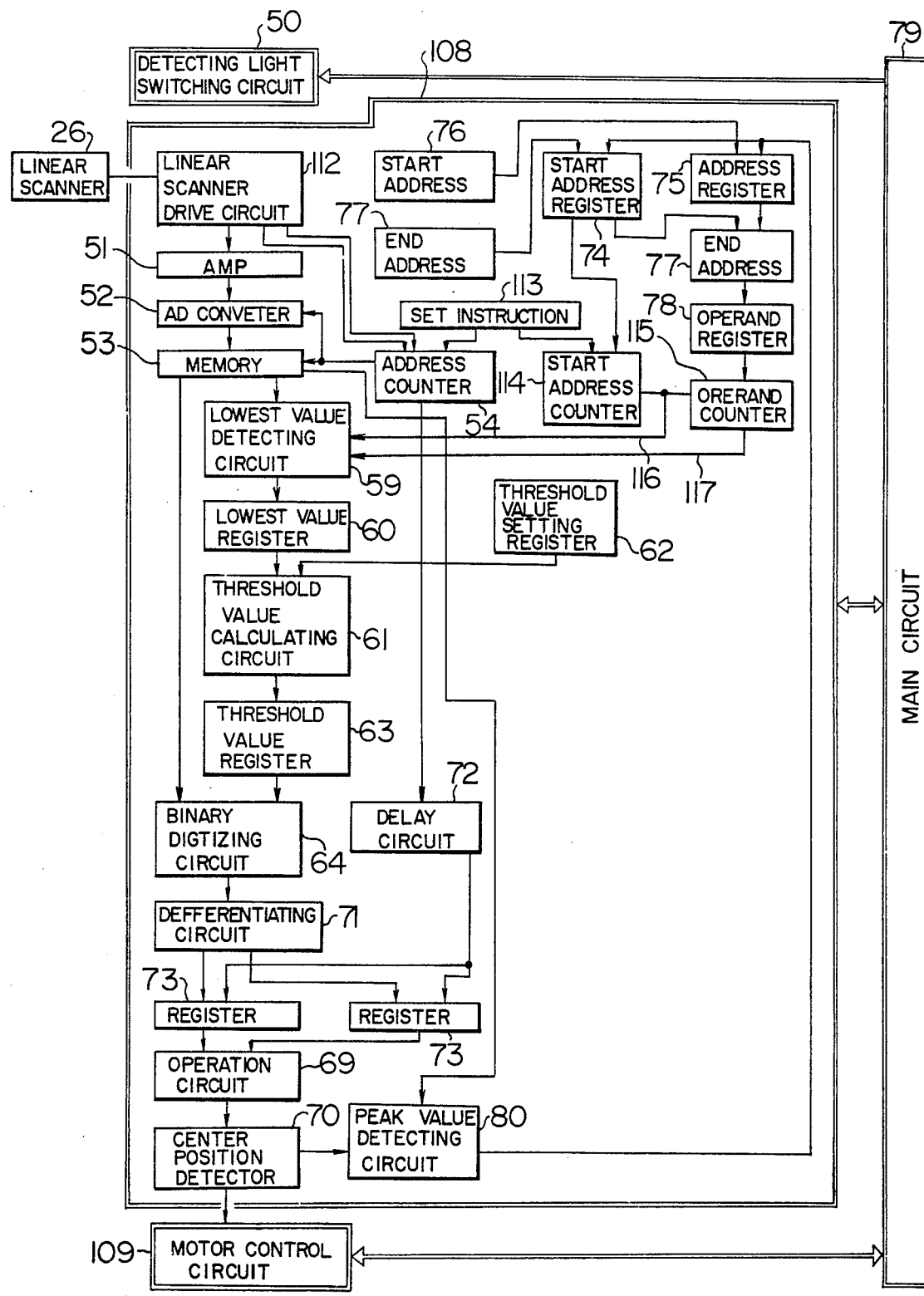
FIG. 16 shows a block diagram of a position detecting circuit shown in FIG. 13.

FIG. 16 shows an example of the position detecting circuit 108. The main circuit 79 controls the position detecting circuit 108, a detecting light switch circuit 50 for switching light sources 28a and 29a one to another and a motor control circuit 109. The rough position detecting source is firstly activated. A video signal produced by the line scanner 26 passes through a line scanner drive circuit 112, an amplifier 51, and A-D converter 52 and then to a video signal memory 53. In the memory 53, the signal is stored in the digital form with multigradation. The signal in the memory 53 is subsequently read out by an address counter 54 and the lowest value $V_0'$ is detected by a lowest value detecting circuit 59 and the detected one is loaded into a lowest value register 60. A threshold operational circuit 61 adds the contents of the register 60 to the contents of a threshold setting register 62 and the summed one is loaded into a threshold register 63. A binary digitizing circuit 64 compares the contents of the threshold value register 63 with the contents of the memory 53 read out by the address counter and converts it into a binary form, "1" or "0". Then, it is differentiated by a differentiating circuit 71 and then a positive going signal and a negative going signal are extracted. Through the comparison of the position signal with an address signal coming through a delay circuit 72 from the address counter 54, the edge addresses are determined and stored in the register 73. By using both edges, the center value address is calculated in the calculation circuit 62, and is loaded into the register 62. In this manner, the rough detecting position is obtained.

The accurate position detection is peformed by using the same loop. In this case, in order to limit the scanning range to be narrow, a peak value detecting circuit 80 detects range setting addresses $X_5'$ and $X_6'$ representing the first peaks of both sides from the rough detecting position $XC_1'$ and the contents of the memory 53, and the detected ones are loaded into a start address register 74 and an end address register 75. In the rough detecting operation, a start address 76 and an end address 17, which are previously set in a wide range, are stored in both the registers 74 and 75.

The controls of operation start and operation end are carried out in the following manner.

A difference between both the registers 74 and 75 is operated by a calculating circuit 77 and the result of the calculation is stored in the operand register 78. A set instruction 113 makes the address counter 54 and the start address counter 114 to start. When the start address counter 114 counts to reach the contents of the start address register 74, an operation initiating signal is produced and the operand counter 115 starts to count. When the counter 115 counts the contents of the operand register 78, an operation end signal is issued to stop the operation.

As described above, the operational processing and the position detection are carried out as in the rough position detection, with the result that the accurate position detection is effected and the value XC₂' is stored in the center value register 70.

The circuit is so designed that the rough detection threshold value DV₁' and the accuracy detection threshold value DV₂' are separately stored in the threshold value register 62. A logic judgement function such as error check is included in the main circuit 79.

As described above, there are two methods to detect the street position; a method to smooth the video signal and a method to switch illuminations one to another. In order to make the video signal have the rough position of street with a wide width and a low level, either case needs at least the oblique illumination in the position detecting direction (Y-direction), that is to say, the dark field illumination. When the rough position is detected by the illumination switching method, the dark field illumination needed is the one by which the longitudinal edge (the edge directed in the X-direction) is not detected. The illumination in which the wafer is illuminated obliquely and symmetrically from opposite sides is not essential but the illumination from one side is permitted. However, in case where the video signal is used for both the rough and accurate position detections, the symmetrical illumination is necessary since both edges of the street must be detected. In case where the rough and precise positions are detected by switching the illumination methods, since the edges of the street must be detected, the dark field illumination may be replaced by a bright field illumination in which the wafer is illuminated from right above and the regular reflecting rays, not the irregular reflecting rays, are received.

In the above example, luminous flux is compressively condensed (i.e. totalized) in the X-direction normal to the position detecting direction and is imaged on the line scanner and the corresponding video signal is produced by the line scanner. When a two-dimensional photodiode array with about the same resolution as that of the line scanner is used, for example, the video signal is sampled by using the horizontal synchronizing signal to extract analog signals of picture elements. The analog signals are then converted into digital signals with multigradation. The digitized signal is counted by the number of scanning lines in a direction (X-direction) normal to the position detection direction and is electrically totalized. The video signal resulting from this process is as shown in FIG. 15C.

Figure 5:
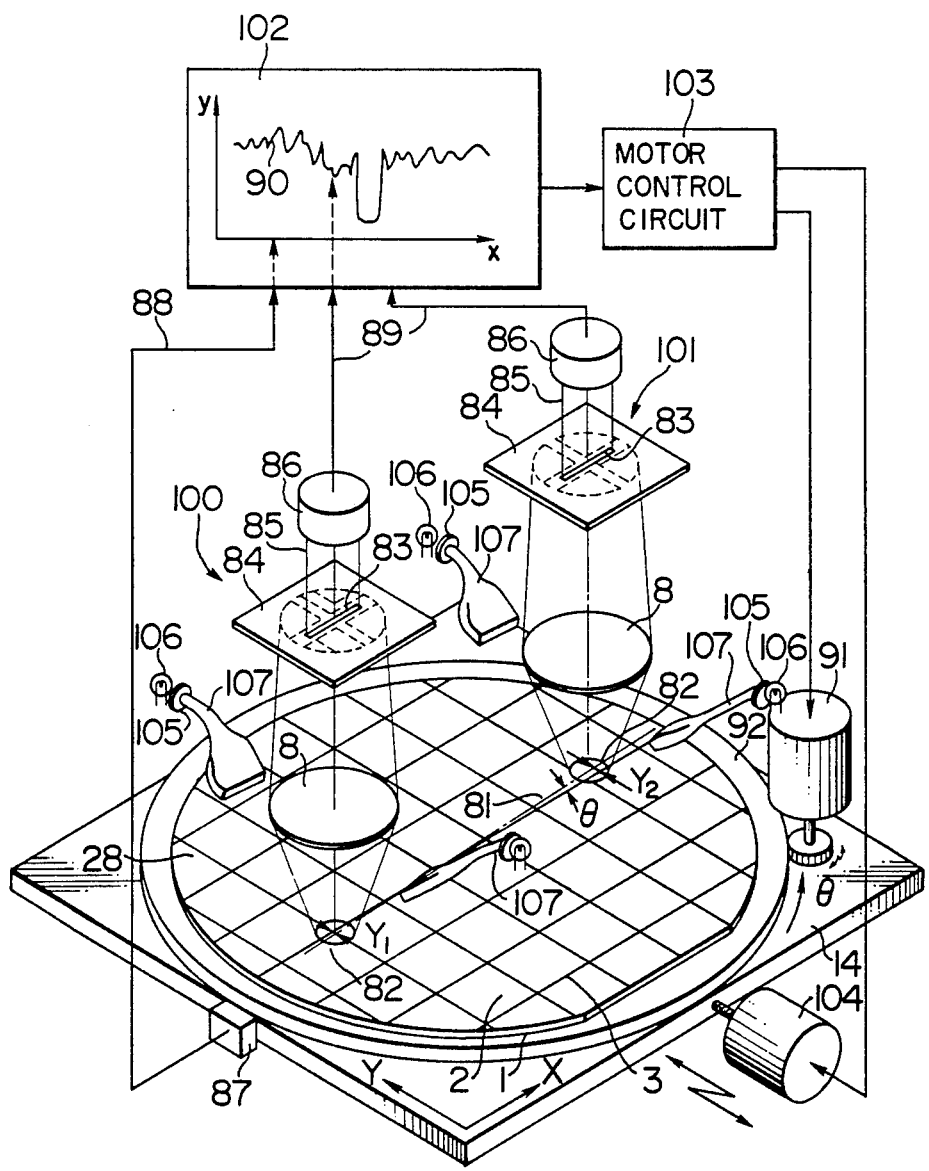
FIG. 5 shows a schematic diagram of an embodiment of an apparatus for detecting the positions of chips on a semiconductor wafer according to the invention.

As described from the foregoing description, when the image pickup devices 84 and 76 and the linear encoder 87 are used as shown in FIG. 5, the edges of the street may be detected with the position detection accuracy of about 1 μm over a wide field of about 6 mm×6 mm. Further, the image pickup device 26 with 1024 or more photographing elements one-dimensionally arranged are used as shown FIG. 13 so as to photograph the field of 2 mm×2 mm one time, the position of the street may be detected from the video signal and further the edges of the street may also be detected with the position detection accuracy of approximately ±2 μm.

We claim:

1. A method for detecting positions of chips on a semiconductor wafer comprising the steps of:
   an illuminating step for illuminating obliquely the semiconductor wafer from above including at least a position detecting direction;
   an optically totalizing step for optically totalizing irregular reflecting rays reflecting at the semiconductor wafer illuminated at said illuminating step in the direction orthogonal to the position detecting direction;
   a video signal detecting step for producing a video signal with coordinates lying in the position detecting direction by photographing an image resulting from optical totalization in said optical totalizing step by an image pickup device; and
   a street position detecting step for detecting a street position between chips by extracting a specific ordinate with a wide width and a level corresponding to dark from the video signal produced at the video signal detecting step.

2. A method for detecting positions of chips on a semiconductor wafer comprising the steps of:
   an illuminating step for illuminating obliquely the semiconductor wafer from above including at least a position detecting direction;
   a video signal detecting step for producing a video signal with coordinates lying in two-dimensional direction by an image pickup device from irregular reflecting rays reflected at the semiconductor wafer illuminated at said illuminating step;
   a video signal totalizing step to obtain coordinates lying in the position detecting direction by electrically totalizing, for each coordinate in the position detecting direction, the levels of the video signal produced at said video signal detecting step in the position detecting direction; and
   a street position detecting step for detecting a street position between chips by extracting a specific ordinate with a wide width and a level corresponding to dark from the video signal produced in the video signal detecting step.

3. An apparatus for detecting positions of chips on a semiconductor wafer comprising:
   illumination means for illuminating obliquely the semiconductor wafer from above including at least a position detecting direction;
   optically totalizing means for optically totalizing irregular reflecting rays reflecting at the semiconductor wafer illuminated at said illuminating step in the direction orthogonal to the position detecting direction;
   a video signal detecting means for producing a video signal with coordinates lying in the position detecting direction by photographing an image resulting from optical totalization in said optical totalizing means by an image pickup device; and
   a street position detecting means for detecting a street position between chips by extracting a specific ordinate with a wide width and a level corresponding to dark from the video signal produced by the video signal detecting means.

4. A chip position detecting apparatus according to claim 3, in which said optically totalizing means is provided with a slit extending in the direction normal to the position detecting direction, wherein an image is totalized by making the image pass through said slit thereby to form an image on the light receiving face of said image pickup device.

5. A chip position detecting apparatus according to claim 3, in which said optically totalizing means is provided with a cylindrical lens for totalizing an image by compressively condensing the image in the direction normal to the position detecting direction.

6. A chip position detection apparatus according to claim 3, 4 or 5, in which said image signal detecting means is provided with at least an image pickup device having image pickup elements arranged with same intervals in the position detecting direction wherein a video signal with coordinates lying in the position detecting direction is extractively obtained from said image pickup device.

7. A chip position detecting apparatus according to claim 3, 4 or 5, in which said video signal detecting means is so constructed that the image signal is formed by photographing the image resulting from the optical totalization by said optical totalizing means, and a table bearing the semiconductor wafer thereon is moved in the position detecting direction relative to said image pickup device thereby to obtain coordinates corresponding to an amount of the movement of said table, whereby a video signal with coordinates lying in the position detecting direction is obtained.

8. A chip position detecting apparatus according to claim 3, 4 or 5, in which said street position detecting means is provided with smoothing means for smoothing the video signal produced by video signal detecting means, rough position extracting means for extracting coordinates position representing the lowest level of the video signal smoothed by said smoothing means, and means for detecting the street position between chips by extracting specific coordinates of the video signal obtained from said video signal detecting means on the basis of the coordinates position extracted by said rough position detecting means.

9. A chip position detecting apparatus according to claim 3, 4 or 5 in which said illuminating means is provided with a glass fiber which guides light from a light source to a light outlet and of which the light outlet has a cross section of an ellipsoid, a polygon similar to the ellipsoid or a rectangule.

10. An apparatus for detecting positions of chips on a semiconductor wafer comprising:
illuminating means for illuminating obliquely the semiconductor wafer from above including at least a position detecting direction;
video signal detecting means for producing a video signal with coordinates lying in two-dimensional direction from the irregular reflecting rays reflected at the semiconductor wafer illuminated by said illuminating means of an image pickup device;
video signal totalizing means to obtain coordinates lying in the position detecting direction by electrically totalizing, for each coordinate in the positiion detecting direction, the levels of the video signal detecting means in a direction orthogoanl to the position detecting direction;
street position detecting means for detecting street position between chips by extracting specific ordinates with a wide width and a level corresponding to dark from the video signal produced in the video signal detecting means.

11. An apparatus for detecting positions of chips on a semiconductor wafer comprising:
rough position illuminating means for illuminating obliquely the semiconductor wafer from above including at least a position detecting direction;
accurate position illuminating means for illuminating the semiconductor wafer obliquely and symmetrically from above or from right above;
optically totalizing means for optically totalizing in the direction normal to the position detecting direction the reflecting rays reflecting at the semiconductor wafer illuminated by said rough position illuminating means and said accurate position illuminating means;
video signal detecting means for producing a video signal with coordinates lying in the position detecting direction by photographing the image formed by said optically totalizing means by means of an image pickup device;
switching means for switching said rough position illuminating means to said accurate position illuminating means and vice versa;
rough position extracting means in which said rough position illuminating means is activated by said switching means thereby to extract the position of the lowest level coordinates position of the video signal obtained from said video signal detecting means; and
street position detecting means for detecting a street position between chips by extracting a specific part of the video signal obtained from said video signal detecting means by switching said rough position illuminating means to said accurate position illuminating means by said switching means on the basis of the rough coordinates position extracted from said rough position extracting means.

* * * * *